United States Patent [19]
Mihara et al.

[11] Patent Number: 5,487,032
[45] Date of Patent: Jan. 23, 1996

[54] METHOD AND APPARATUS FOR REDUCED FATIGUE IN FERROELECTRIC MEMORY ELEMENTS

[75] Inventors: Takashi Mihara, Saitama; Hitoshi Watanabe, Tokyo; Hiroyuki Yoshimori, Kanagawa, all of Japan; Carlos A. Paz de Araujo; Larry D. McMillan, both of Colorado Springs, Colo.

[73] Assignees: Symetrix Corporation, Colorado Springs, Colo.; Olympus Optical Co., Ltd., Tokyo, Japan

[21] Appl. No.: 338,003

[22] Filed: Nov. 10, 1994

[51] Int. Cl.$^6$ .................................................. G11C 11/22
[52] U.S. Cl. ........................................ 365/145; 365/189.01
[58] Field of Search .................... 365/145, 189.01, 365/230.01

[56] References Cited

U.S. PATENT DOCUMENTS

| | | | |
|---|---|---|---|
| 4,888,733 | 12/1989 | Mobley | 365/145 |
| 4,893,272 | 1/1990 | Eaton, Jr. et al. | 365/145 |
| 4,910,708 | 3/1990 | Eaton, Jr. et al. | 365/145 |
| 5,414,654 | 5/1995 | Kubota et al. | 365/145 |

*Primary Examiner*—Terrell W. Fears
*Attorney, Agent, or Firm*—Duft, Graziano & Forest

[57] ABSTRACT

A method and apparatus for programming ferroelectric memory cells which reduces fatigue effects of switching polarization of the ferroelectric devices associated with the memory cells such as ferroelectric capacitors and transistors. Alteration of the rise AC fall times associated with signals used to switch ferroelectric device polarization are shown to reduce fatigue of the ferroelectric material thereby increasing the useful life of ferroelectric memory cells. Slowing the rise and fall times as well as the rate of signal level rise and fall, (signal shape), are shown to reduce the fatigue effects of switching polarization of ferroelectric devices. Methods and apparatus for producing a triangular ("sawtooth") signal waveform, a Gaussian signal waveform, and a waveform having exponential rise and fall times are disclosed.

18 Claims, 8 Drawing Sheets

METHOD AND APPARATUS FOR REDUCED FATIGUE IN FERROELECTRIC MEMORY ELEMENTS

BACKGROUND OF THE INVENTION

FIELD OF THE INVENTION

The invention relates, in general, to non-volatile electronic memories and more particularly to a method and apparatus for reducing fatigue on a ferroelectric device in a memory cell by altering the waveform shape of signals used for switching the ferroelectric material polarization.

PROBLEM

It is known that ferroelectric materials are capable of retaining a polarization which can be used to store information in a non-volatile memory. For example, if a strong enough electric field is placed across a ferroelectric capacitor, when the electric field is removed, a polarization in the direction of the field remains within the ferroelectric material of the capacitor. If the electric field is placed across the same capacitor in the opposite direction, when the field is removed, a polarization in the opposite direction remains within the ferroelectric capacitor. Electronic sense circuits have been designed to associate the remnant polarization in one direction with a logic "1" state, and remnant polarization in the opposite direction with a logic "0" state. A useful circuit for this purpose is disclosed in co-pending U.S. patent application Ser. No. 08/092,233, filed on Jul. 15, 1993 by Mihara et al. These sense circuits are similar to, and adapted from, those found in more traditional DRAM devices. In sensing the polarization state of a ferroelectric capacitor, the polarization is altered, therefor the sense circuit also includes a capability to re-write the original polarization state back to the memory cell after sensing the present state.

Ferroelectric RAM structures, like traditional memory structures, include memory cells arranged in rows and columns. Each memory cell typically includes at least one transistor having a gate, source, and drain, and a capacitor having a pair of plate electrodes. Each memory cell further includes plate lines connected to one plate electrode of the capacitor in each cell, bit lines connected to the other plate of the capacitor through the transistor, and word lines connected to the control gate of the transistor. The transistor acts as a switch controlled by its gate, to connect the capacitor to the plate line.

All known prior designs for memories which utilize ferroelectric devices share a common problem in that the frequent, rapid switching of the polarization of a ferroelectric material tends to fatigue the ferroelectric material. Rapid switching of the ferroelectric material, over time, is believed to break down the lattice structure of the ferroelectric crystal. The ability of ferroelectric material to retain a remnant polarization state diminishes as the lattice structure of the material breaks down. In normal operation many millions of operations per second may be performed on a memory cell which may switch, and thereby fatigue, the ferroelectric capacitor in a memory cell. If the ferroelectric RAM fatigues quickly, the memory has too short a useful lifetime. For example, each write operation to a memory cell which changes the contents of the memory cell causes a switch in the polarization of the ferroelectric material. In addition, each read operation, as discussed above, may cause the polarization of the ferroelectric capacitor to be switched twice: once to sense the present polarization (by destructively sensing the polarization), and again to restore the polarization. This fatigue of ferroelectric material as used in capacitors of non-volatile RAMs has been a contributing factor in the lack of commercial success for ferroelectric RAM memory devices.

SOLUTION

The present invention reduces the above identified fatigue problem by providing apparatus and methods applied within a memory device which switches the ferroelectric capacitor polarization in a manner which reduces the fatigue of the ferroelectric material.

As in all prior designs, signals applied to the electrodes of a ferroelectric capacitor of a memory cell switch the polarization of the ferroelectric material when the electric field potential between the electrodes of the ferroelectric capacitor reaches a sufficient (coercive threshold) amplitude. These signals may be characterized by their rise time and fall time. The rise time of a signal is the time required for the signal to rise from its original low state to a level indicative of a new high state. The fall time of a signal is the time required for the signal to drop to a level indicative of return to the original low state. Between the rise time and the fall time, a signal is held at the high level indicating its new state. When viewed on a standard oscilloscope, the shape of the signal which includes the rise and fall times plus the intervening hold time may be characterized by geometric shapes. For example, a square signal has rapid rise and fall time whereas a triangular (sawtooth) signal has much slower rise and fall times.

Prior designs have applied signals which are substantially in the form of square signals or waveforms due to the rapid rise and fall times. The present invention comprises methods and apparatus for a drive circuit which controls the shape of electronic signals applied to the electrodes of a ferroelectric capacitor. Several waveform shapes having rise and fall times slower than prior square wave designs and are found to reduce the fatigue of the ferroelectric material. The methods and apparatus of the present invention are capable of forming several different waveform shapes by controlling the time and shape of the signal as it rises to a new state and falls to its original state. These several shapes are characterized by slower rise and fall times. Slower rise and fall times are found to reduce the fatiguing effect of rapid changes in polarization of the ferroelectric capacitor of a memory cell.

One exemplary embodiment of the present invention produces a signal waveform in which the signal hold time is approximately zero and the signal rise and fall times are approximately equal. By slowing this signals rise and fall time, the signal waveform appears on a standard oscilloscope as a triangular shape also referred to herein as a "sawtooth" waveform. The methods of the present invention which produce a "sawtooth" signal shape are demonstrated to increase the useful lifetime of a ferroelectric capacitor by more than one order of magnitude as measured by the number of cycles preceding a 50% loss of polarizability due to fatigue. Numerous other features, objects and advantages of the present invention will become apparent from the following description when read in conjunction with the accompanying drawings.

DETAILED DESCRIPTION

Memory Array Control and Addressing

Figure 1:
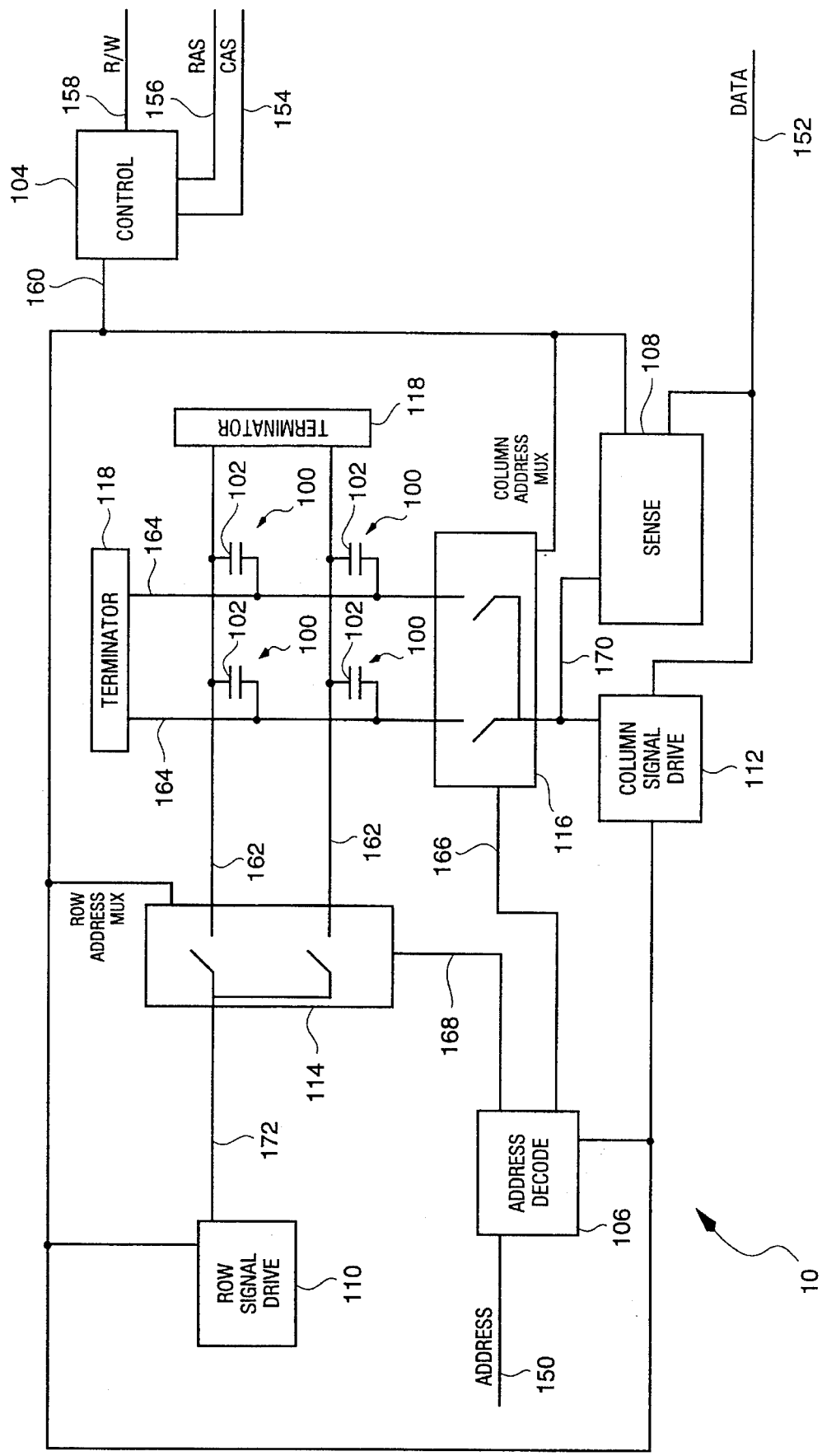
FIG. 1 is a block diagram of a exemplary embodiment of a memory array device which includes the apparatus, and employs the methods, of the present invention.

FIG. 1 shows an overview of a typical memory array 10 comprising four memory cells 100 arranged in a two by two matrix. It will be recognized by one skilled in the art that memory array 10 may be scaled to many different sizes as particular application may require. Preferably, memory array 10 comprises a number of rows and a number of columns, each such number being a power of two so as to simplify the associated logic designs for address decoding in typical computing applications. Memory cells 100 are often referred to as "raw" cells because each cell is designed with a single ferroelectric capacitor 102. In the embodiment of FIG. 1, each memory cell 100 includes a ferroelectric capacitor 102, although, as known in the art, it may be some other ferroelectric device, such as a ferroelectric transistor. "Ferroelectric memory element" as used herein refers to any ferroelectric devices used within a memory cell 100. Ferroelectric capacitor 102 in each memory cell 100 is coerced to one of two directions of polarization by application of a coercive electric field. Ferroelectric capacitor 102 retains a remnant polarization after the electric field is removed. Sense 108 is designed to associate the remnant polarization in one direction with a logic "1" state, and remnant polarization in the opposite direction with a logic "0" state.

Memory control and addressing circuits described herein are operable in conjunction with row signal drive 110 and column signal drive 112 circuits which apply signals to the electrodes of a selected one of the plurality of memory cells 100 of the memory array 10. To access a particular memory cell 100, first, a utilizing means, (not shown, hereinafter referred to as CPU), applies a signal to input R/W 158 to indicate whether the memory cycle is a read or write operation. If input R/W 158 indicates that the memory cycle is to be a write operation to memory array 10, then the CPU also applies a data value to data bus 152. Next, CPU applies a row address to address bus 150 indicating which of the two rows of memory array 10 is to be accessed by the memory cycle and applies a signal to RAS 156 to indicate that the row address is valid on address bus 150. Next, CPU applies a column address to address bus 150 indicating which of the two columns of memory array 10 is to be accessed by the memory cycle and applies a signal to CAS 154 to indicate that the column address is valid on address bus 150. If R/W 158 indicates that the memory cycle is to be a read operation from memory array 10, then the current state of the addressed bit is sensed by sense 108 over bus 170 and applied to data bus 152. It will be recognized by one skilled in the art that a read memory cycle of a ferroelectric memory cell typically requires a write operation to restore the contents of the memory cell 100 after the read cycle senses the current data value in the memory cell. A read operation sense of the polarization of the ferroelectric capacitor 102 may alter the polarization in the process. The methods and apparatus used to sense the polarization of the ferroelectric capacitor are discussed in the referenced art cited above.

In the block diagram of FIG. 1, control logic 104 senses signals applied to inputs R/W 158, RAS 156, and CAS 154 by a CPU (not shown) which cause control logic 104 to control other components of memory array 10 by application of signals to control bus 160. These other components decode the CPU supplied address into a selected row and column associated with a desired memory cell 100. One skilled in the art will readily recognize the address decode apparatus and methods described herein. Such techniques and logic circuits are known in the art and are provided herein for purposes of describing an exemplary environment in which the present invention is applicable. Control logic 104 applies a signal to address decode 106 over control bus 160 when a signal is sensed on input RAS 156. In response, address decode 106 controls row address mux 114 by applying signals to bus 168 indicative of the row selected by the value applied to address bus 150 by CPU (not shown). Row address mux 114 applies the output of row signal drive 110 on bus 172 to either of two word lines 162 depending on the output of address decode 106 received on bus 168. In like manner, control logic 104 applies a signal to column address decode 106 when a signal is sensed on input CAS 154 causing address decode 106 to control column address mux 116 by applying signals to bus 166 indicative of the column selected by the value applied to address bus 150 by CPU (not shown). Column address mux 116 connects bus 170 to either of two bit lines 164 depending on the output of address decode 106 received on bus 166.

If the signal on input R/W 158 indicates a write access to a selected memory location, column address mux 116 serves to connect the output signal column signal drive 112 to one of two bit lines 164 to provide an appropriate electric field across a ferroelectric capacitor 102 at the intersection of a word line 162 and a bit line 164. The polarity of the signal output from column signal drive 112 onto bus 170 is determined by the signal received on data bus 152. The amplitude of the electric field present at the ferroelectric capacitor 102 at the intersection of a word line 162 and a bit line 164 is determined by the magnitude, timing, and shape of the signals generated at the outputs of row signal drive 110 and column signal drive 112. When the amplitude of the electric field exceeds a threshold value, (the coercive threshold), the polarity of the ferroelectric capacitor is changed to match the polarity of the electric field. If R/W 158 indicates a read access to a memory location, control logic 104 causes column address mux 116 to connect the bidirectional signal of sense 108 through bus 170 to one of two bit lines 164. Sense 108 senses the current polarity of the ferroelectric capacitor 102 at the intersection of the word line 162 and the bit line 164 selected by row address mux 114 and column address mux 116, respectively. Sense 108 applies a signal to data bus 152 indicative of the present polarity of the sensed ferroelectric capacitor 102. Sense 108 senses the polarity of the selected ferroelectric capacitor in a non-destructive manner by restoring the capacitor to the sensed value. Circuits which sense the direction of polarity are known to those of ordinary skill in the art as discussed above. Terminators 118 provide impedance matching on word lines 162 and bit lines 164 as is known in the art.

Figure 2:
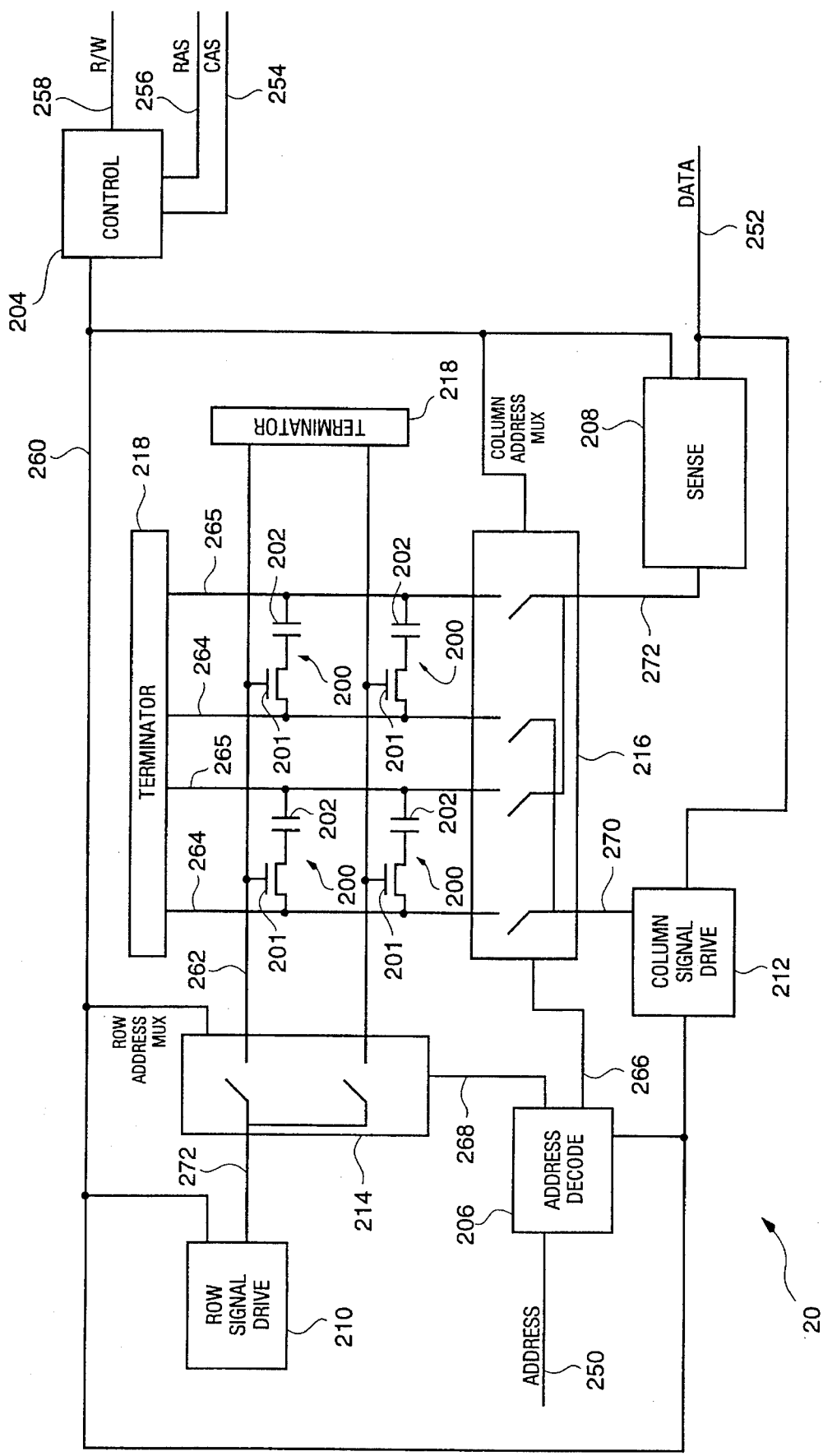
FIG. 2 is a block diagram of another exemplary embodiment of a memory array device which includes the apparatus, and employs the methods, of the present invention.

FIG. 2 shows an overview of another typical memory array 20 comprising four memory cells 200 arranged in a two by two matrix. Memory cells 200 are referred to as "active" cells because each cell is designed with a single ferroelectric capacitor 202 and a gating transistor 201. Ferroelectric capacitor 202 in each memory cell 200 is coerced to one of two directions of polarization by application of an electric field having an amplitude greater than the coercive electric field required to switch the ferroelectric capacitor 202 polarization.

Figure 10:
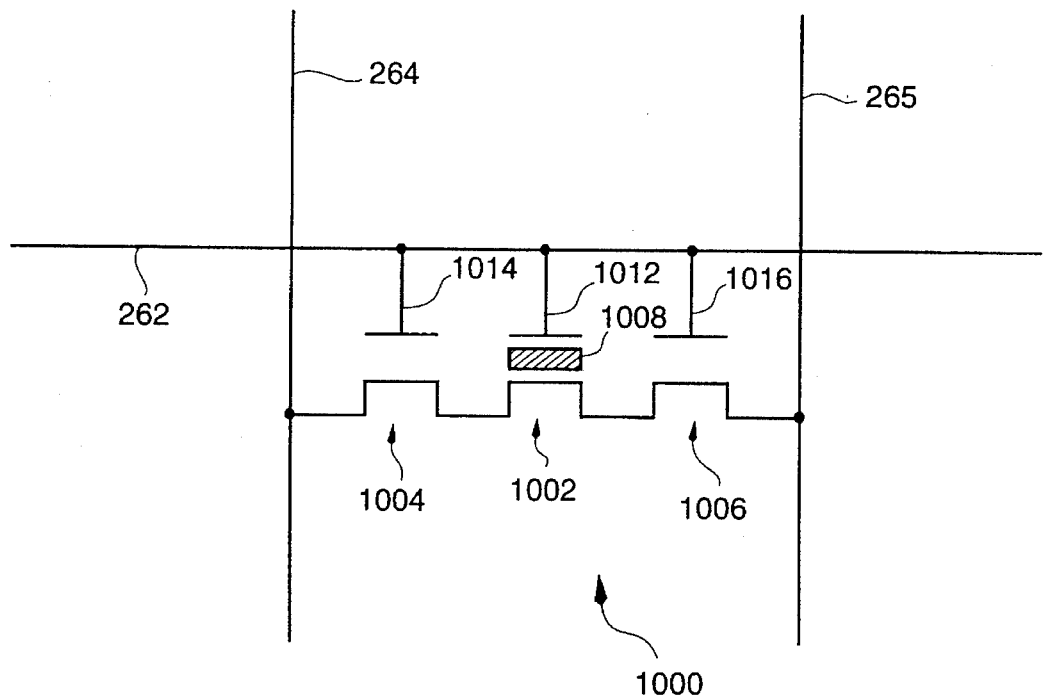
FIG. 10 diagrams an alternative embodiment of a circuit which implements a single "active" memory cell as may be used in the embodiment of FIG. 2 with a ferroelectric transistor.

In the embodiment of FIG. 2, each memory cell 200 includes a ferroelectric capacitor 202, although, as known in the art, it may be some other ferroelectric device, such as a ferroelectric transistor. Ferroelectric memory element as used herein refers to any ferroelectric devices used within a memory cell 200. FIG. 10 shows an alternative embodiment of the circuit which comprises a single memory cell 1000 in which a ferroelectric transistor 1002 is used in conjunction with two gating transistors 1004 and 1006. The ferroelectric nature of ferroelectric transistor 1002 is indicated by a rectangle which represents the ferroelectric material 1008. The polarization state of ferroelectric material 1008 is determined by the electric field potential between the gate 1012 of ferroelectric transistor 1002 and the source and drain of pass gate transistors 1004 and 1006. Pass gate transistors connect the signals applied to bit line 265 apply plate line 264 to the base of ferroelectric transistor 1002. The gates of all three transistors 1002, 1004, and 1006 are activate by a signal applied to word line 262. Use of a ferroelectric transistor 1002 in a memory cell 1000 is more fully understood with reference to co-pending U.S. patent application Ser. No. 08/330,989, filed on Oct. 28, 1994 by Mihara et al.

Ferroelectric capacitor 202 retains a remnant polarization after the electric field is removed. Sense 208 is designed to associate the remnant polarization in one direction with a digital logic "1" state, and remnant polarization in the opposite direction with a logic "0" state.

Memory control and addressing circuits described herein are operable in conjunction with row signal drive 210 and column signal drive 212 circuits which apply signals to the electrodes of a selected one of the plurality of memory cells 200 of the memory array 20. To access a particular memory cell 200, first, a utilizing means, (hereinafter assumed to be a CPU), applies a signal to input R/W 258 to indicate whether the memory cycle is a read or write operation. If R/W 258 indicates that the memory cycle is to be a write operation to memory array 20, then the CPU also applies a data value to data bus 252. Next, CPU applies a row address to address bus 250 indicating which of the two rows of memory array 20 is to be accessed by the memory cycle and applies a signal to RAS 256 to indicate that the row address is valid on address bus 250. Next, CPU applies a column address to address bus 250 indicating which of the two columns of memory array 20 is to be accessed by the memory cycle and applies a signal to CAS 254 to indicate that the column address is valid on address bus 250. If R/W 258 indicates that the memory cycle is to be a read operation from memory array 20, then the current state of the addressed bit is sensed by sense 208 over bus 272 and applied to data bus 252. It will be recognized by one skilled in the art that a read memory cycle typically requires a write operation to restore the contents of the memory cell 200 after the read cycle senses the current data value in the memory cell. A read operation sense of the polarization of the ferroelectric capacitor 202 may alter the polarization in the process. The methods and apparatus used to sense the polarization of the ferroelectric capacitor are discussed in the referenced art cited above.

In the block diagram of FIG. 2, control logic 204 senses signals applied to inputs R/W 258, RAS 256, and CAS 254 by a CPU (not shown) which cause control logic 204 to control other components of memory array 20 by application of signals to control bus 260. These other components decode the CPU supplied address into a selected row and column of the desired memory cell 200. Control logic 204 applies a signal to address decode 206 over control bus 260 when a signal is sensed on RAS 256. In response, address decode 206 controls row address mux 214 by applying signals to bus 268 indicative of the row selected by the value applied to address bus 250 by CPU (not shown). Row address mux 214 applies the output of row signal drive 210 on bus 272 to either of two word lines 262 depending on the output of address decode 206 received on bus 268. In like manner, control logic 204 applies a signal to column address decode 206 when a CAS 254 signal is received causing address decode 206 to control column address mux 216 by applying signals to bus 266 indicative of the column selected by the value applied to address bus 250 by CPU (not shown). Column address mux 216 connects bus 270 to either of two plate lines 264 depending on the output of address decode 206 received on bus 266.

If R/W 258 indicates a write access to a memory location, column address mux 216 serves to connect the output signal column signal drive 212 to one of two plate lines 264 thereby providing an appropriate electric field across a ferroelectric capacitor 202 at the intersection of a word line 262 and a plate line 264. The polarity of the signal output from column signal drive 212 onto bus 270 is determined by the signal received on data bus 252. The amplitude of the electric field present at the ferroelectric capacitor 202 at the intersection of a word line 262 and a plate line 264 is determined by the magnitude, timing, and shape of the signals generated at the outputs of row signal drive 210 and column signal drive 212. When the amplitude of the electric field exceeds a threshold value, (the coercive threshold), the polarity of the ferroelectric capacitor is changed to match the polarity of the electric field. If R/W 258 indicates a read access to a memory location, control logic 204 causes column address mux 216 to connect the bidirectional signal of sense 208 through bus 270 to one of two bit lines 265. Sense 208 senses the current polarity of the ferroelectric capacitor 202 at the intersection of the word line 262 and the bit line 265 selected by row address mux 214 and column address mux 216, respectively. Sense 208 applies a signal to data bus 252 indicative of the present polarity of the sensed ferroelectric capacitor 202. Sense 208 senses the polarity of the selected ferroelectric capacitor in a non-destructive manner by restoring the capacitor to the sensed value. Circuits which sense the direction of polarity are known to those of ordinary skill in the art as discussed above. Terminators 218 provide impedance matching on word lines 262, bit lines 265, and plate lines 264 as is known in the art.

The block diagrams of FIGS. 1 and 2 are intended only as examples of embodiments of memory arrays which may employ the methods and apparatus of the present invention. One skilled in the art will recognize that many other ferroelectric ram cell designs and memory array control designs are possible which may include the methods and apparatus of the present invention. In particular, the precise apparatus and methods for decoding a CPU supplied address as well as the timing of the various signals discussed above may be varied as required for the particular application. In addition, one skilled in the art will recognize that the ferroelectric memory element within each memory cell 100 or 200 may be any ferroelectric device such as a capacitor or a transistor. It will be recognized by one skilled in the art that many equivalent methods and apparatus may be employed for selecting a particular one of the plurality of memory cells 100 or 200 in a memory array 10 or 20. In all such cases, the selection methods and apparatus are operable in conjunction with signal drive circuits which apply signals to the electrodes of a selected ferroelectric capacitor for purposes of changing the polarization thereof.

Fatigue Reduction Method

It is known by those skilled in the art that repeated, rapid, changes in the polarization of a ferroelectric material causes a reduction in the polarizability of the ferroelectric material. "Polarizability", as used herein, is a measure of the degree of remnant polarization in a ferroelectric material following application and removal of a coercive electric field. "Polarizability fatigue", as used herein, is defined to be a reduction in the polarizability of a ferroelectric material in response to repetitive cycling of the direction of remnant polarization of a ferroelectric material. Methods of the present invention reduce the polarizability fatigue effects of such rapid changes of ferroelectric material polarization by slowing the rise time of the signals applied to the ferroelectric material for creating a coercive electric field.

The methods of the present invention apply non-square waveform electric field signals to the electrodes of a ferroelectric capacitor. Square waveforms of prior designs are characterized by a rapid rise of the signal amplitude from a first level to a maximum amplitude followed by a similarly rapid fall of the signal amplitude back to the first level. Between the signal rise and fall, the signal is held at the maximum amplitude for a predetermined period of time. Such a waveform signal is considered square because of its visual appearance on a standard oscilloscope.

Figure 8:
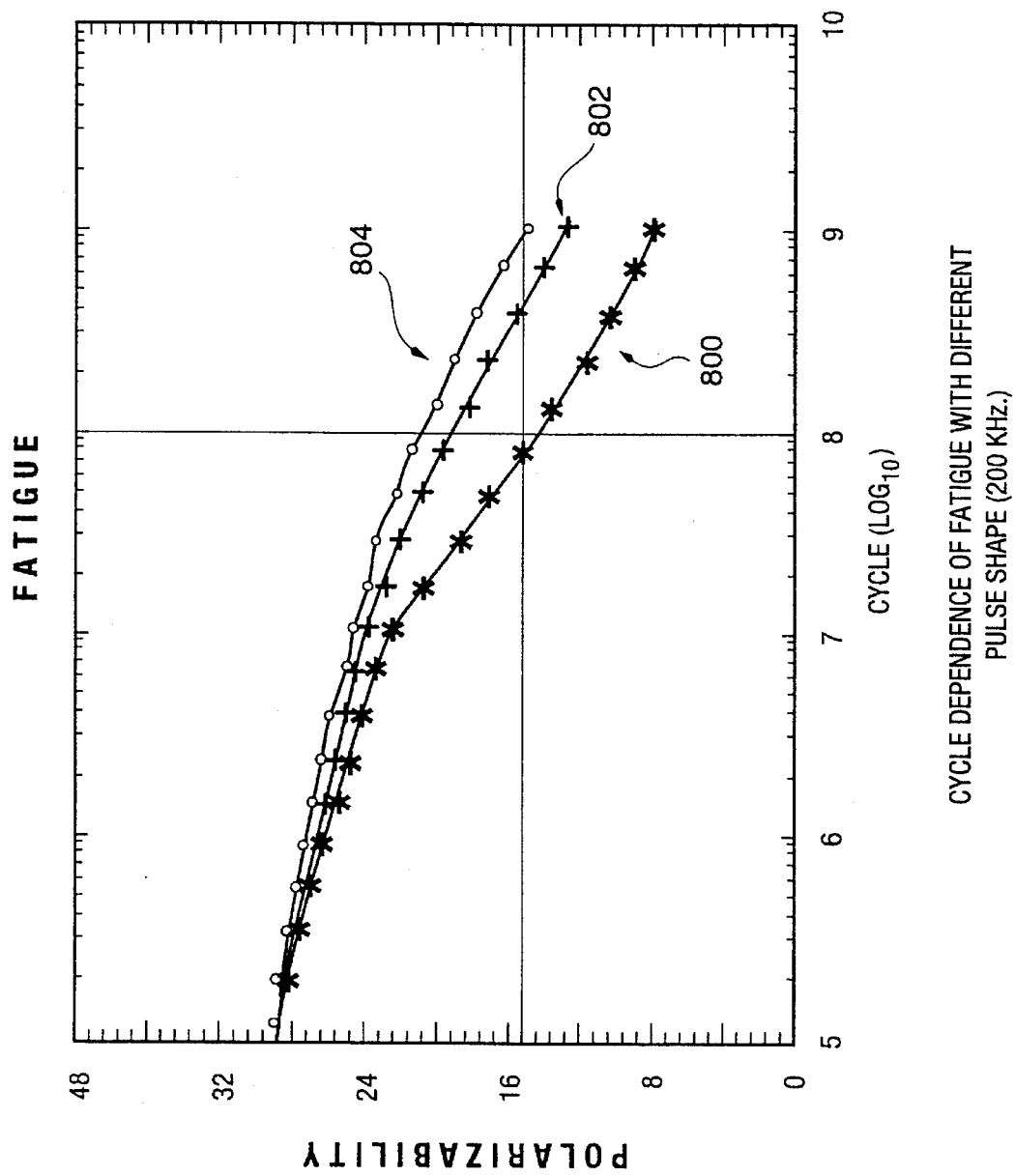
FIG. 8 is a graph depicting the decrease in remnant polarizability as a function of the number of changes in polarization of a ferroelectric capacitor in response to three different waveforms applied at a 200-Khz frequency.
Figure 9:
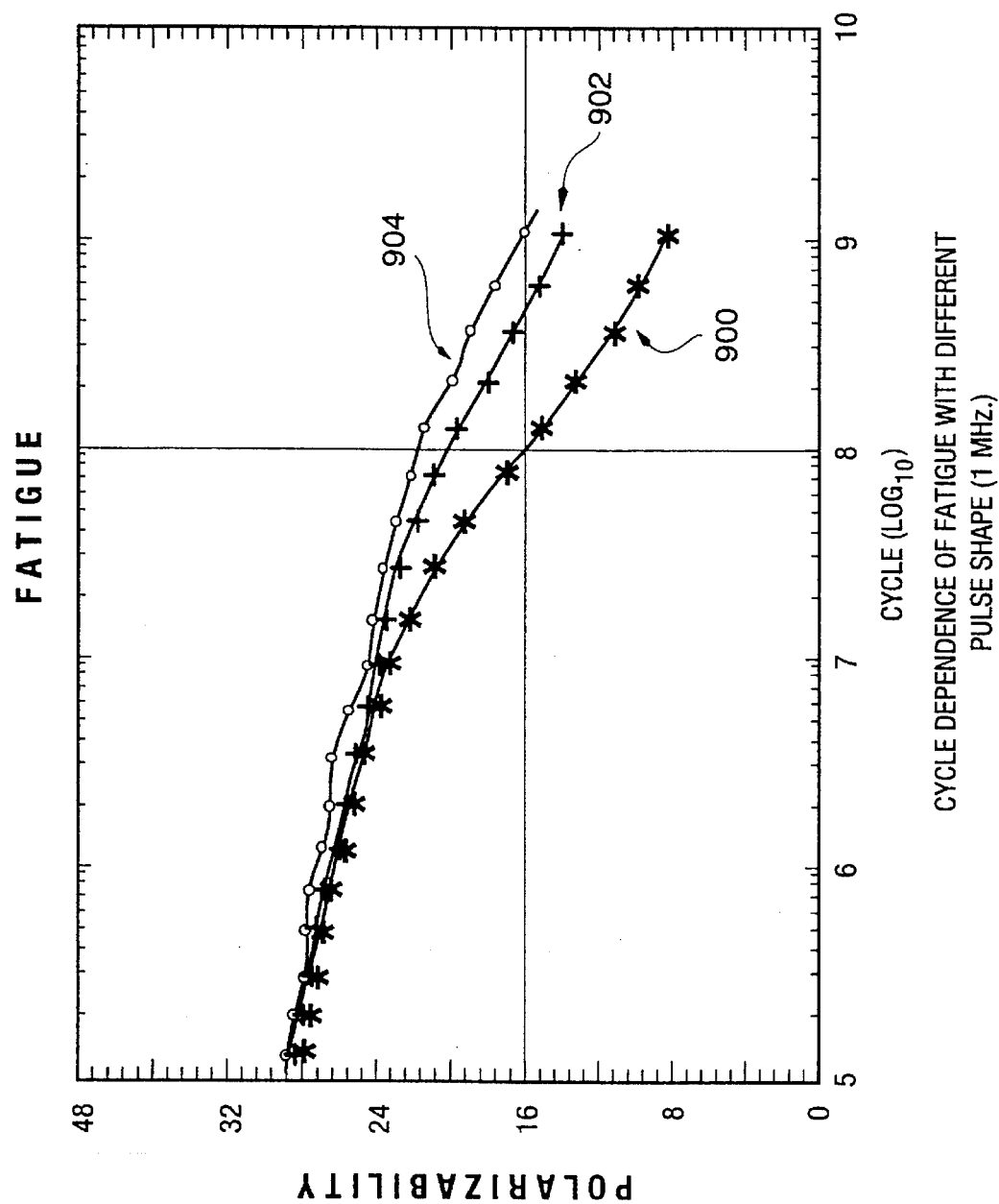
FIG. 9 is a graph depicting the decrease in remnant polarizability as a function of the number of changes in polarization of a ferroelectric capacitor in response to three different waveforms applied at a 1-Mhz frequency.

By slowing the rise or fall time of the signal, the signal no longer appears visually square on a standard oscilloscope. For example, the methods and apparatus of the present invention discussed below describe a triangular signal as one with a linearly rising signal amplitude during the signal rise time immediately followed by a linearly falling signal amplitude during the signal fall time. The hold time for the triangular waveform signal is approximately zero. Such a triangular waveform is frequently referred to as a "sawtooth" waveform. An exemplary sawtooth waveform was applied to a ferroelectric capacitor at 200 Khz and at 1 Mhz and the resulting increase in useful lifetime of the capacitor is shown in FIGS. 8 and 9 discussed below. The rise and fall times of these exemplary triangular signals are approximately equal and are both greater than about 250 nanoseconds (in the case of the 1 Mhz signal and greater than about 1.25 microseconds in the case of the 200 Khz signal).

Another waveform generated by the methods and apparatus of the present invention is a "Gaussian" waveform (so named due to its appearance on a standard oscilloscope as a Gaussian probability distribution curve). A Gaussian waveform signal has a non-linearly, increasing signal amplitude during the signal rise time immediately followed by a non-linearly, falling signal amplitude during the signal fall time. The hold time for a Gaussian waveform signal is approximately zero. An exemplary Gaussian waveform was applied to a ferroelectric capacitor at 200 Khz and at 1 Mhz and the resulting increase in useful lifetime of the capacitor is shown in FIGS. 8 and 9 discussed below.

Several factors may contribute to the well known effect of polarizability fatigue. Among these factors, it is believed that the accumulation of a large electric field within the ferroelectric capacitor causes the fatigue of the ferroelectric material. A large electric field is believed to accumulate within the ferroelectric material by the combined effects of rapid polarization switching and space charge effects at the surfaces of the ferroelectric material. Regardless of the cause of polarizibility fatigue in a ferroelectric material, evidence demonstrates that slowing the rise and fall times of signals applied to the ferroelectric capacitor plates improves the useful lifetime of the ferroelectric capacitor by reducing the polarizibility fatigue effects.

FIG. 8 shows the polarizability of a ferroelectric material as a function of the number of repetitive cycles of change in polarization. As shown in FIG. 8, the direction of remnant polarization of a ferroelectric material was changed at a frequency of 200-Khz using three different waveforms. Curves 800, 802, and 804 of FIG. 8 show the polarizability of a ferroelectric material decreasing as a function of the number of cycles of changes in direction of remnant polarization. The useful life of a ferroelectric capacitor used in a RAM cell is measured as the number of cycles of polarization change before a 50% loss in polarizability. Curve 800 represents the polarizability fatigue of a ferroelectric material due to the use of a square waveform as taught in prior designs. Curve 802 represents the polarizability fatigue of a ferroelectric material due to the use of a Gaussian waveform generated by methods of the present invention (discussed below with respect to FIG. 4). Curve 804 represents the polarizability fatigue of a ferroelectric material due to the use of a sawtooth waveform generated by methods of the present invention (discussed below as a triangular waveform with respect to FIG. 3). As can be seen in FIG. 8, application of either the Gaussian waveform of curve 802 or the sawtooth waveform of curve 804, as taught by the methods of the present invention, decrease the polarizability fatigue of the ferroelectric material as compared to that exhibited by the square waveform of prior designs and shown in curve 800. This decrease in polarizability fatigue improves the useful lifetime of the ferroelectric capacitor. Specifically, the polarizability fatigue effects of a square waveform on the ferroelectric material, as exhibited in curve 800, reduces the polarizability from by approximately 50% after approximately $7 \times 10^7$ cycles. The polarizability fatigue effects of a sawtooth waveform, as shown in curve 804, reduces the polarizability to a similar level (approximately 50% reduction) but after approximately $1 \times 10^9$ cycles, more than an order of magnitude increase in the useful life of the ferroelectric capacitor. The polarizability fatigue effects caused by use of the Gaussian waveform, as shown in curve 802, are also less than that of the square waveform though the improvement is exhibited to a lesser degree. The polarizability fatigue effects of a Gaussian waveform, as shown in curve 802, reduces the polarizability by approximately 50% reduction after approximately $4 \times 10^8$ cycles, a factor of 6 improvement.

FIG. 9 depicts similar reductions in polarizability fatigue effects resulting from application of three waveforms at a 1-Mhz frequency. Curves 900, 902, and 904 of FIG. 9 show the polarizability of a ferroelectric material decreasing as a function of the number of cycles of changes in direction of polarization changes. Curve 900 represents the polarizability fatigue of a ferroelectric material due to the use of a square waveform as taught in prior designs. Curve 902 represents the polarizability fatigue due of a ferroelectric material o the use of a Gaussian waveform generated by methods of the present invention (discussed below with respect to FIG. 4). Curve 904 represents the polarizability fatigue of a ferroelectric material due to the use of a sawtooth waveform generated by methods of the present invention (discussed below as a triangular waveform with respect to FIG. 3). As can bee seen in FIG. 9, application of either the Gaussian waveform of curve 902 or the sawtooth waveform of curve 904, as taught by the methods of the present invention, decreases the polarizability fatigue of the ferroelectric material as compared to that exhibited by the square waveform of prior designs and shown in curve 900. This decrease in polarizability fatigue improves the useful lifetime of the ferroelectric capacitor. Specifically, the polarizability fatigue effects of a square waveform on the ferroelectric material, as exhibited in curve 900, reduces the polarizability by approximately 50% after approximately $0.5 \times 10^8$ cycles. The polarizability fatigue effects of a sawtooth waveform, as shown in curve 904, reduces the polarizability to approximately the same level, but after more than $10^9$ cycles, more than an order of magnitude increase in the useful life of the ferroelectric capacitor. The polarizability fatigue effects caused by use of the Gaussian waveform, as shown in curve 902, are also less than that of the square waveform though the improvement is exhibited to a lesser degree. The polarizability fatigue effects of a Gaussian waveform, as shown in curve 902, reduces the polarizability to approximately the same level, but after more than approximately $6 \times 10^8$ cycles.

Several factors are involved in a determination of the minimum rise (or fall) time of a signal applied to a ferroelectric material to achieve the desired reduced polarizability fatigue. Empirical data tends to suggest methods for estimating the minimum rise (or fall) time of a signal applied to a ferroelectric material to achieve the desired reduced polarizability fatigue.

Figure 12:
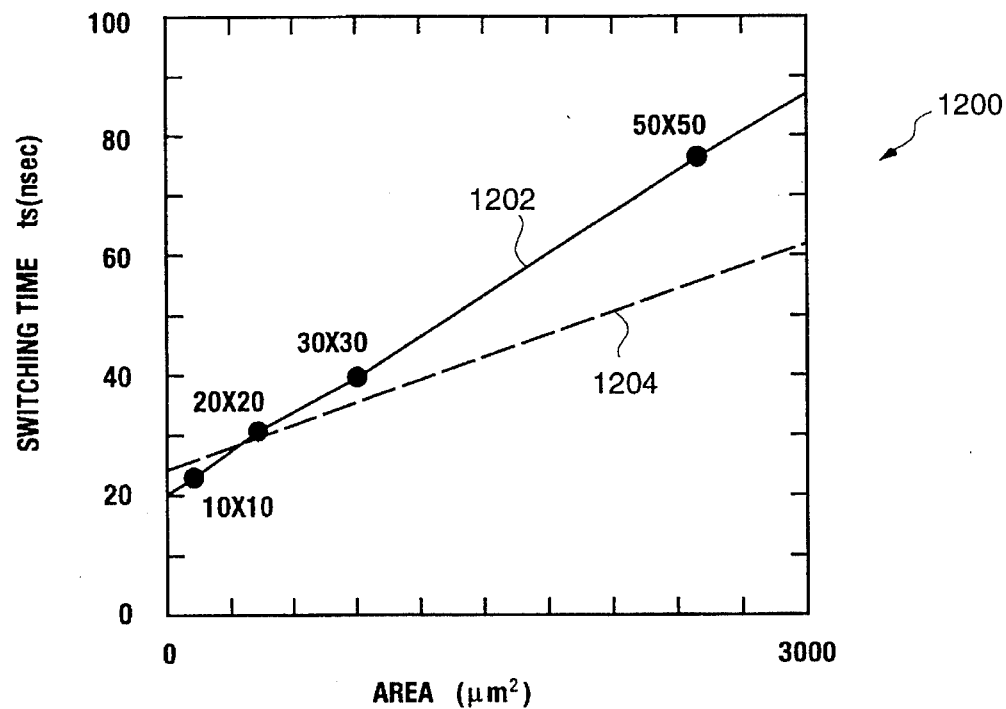
FIG. 12 is a graph of ferroelectric material polarization switching time as a function of capacitor surface area.

A first method of estimating the minimum rise (or fall) time for slower signals applied to ferroelectric material is suggested by the minimum switching time required to change polarization of the ferroelectric material. A ferroelectric material requires a minimum amount of time to switch polarization when an appropriate coercive electric field is applied. This minimum amount of time is referred to herein as "switching time" and by the symbol $t_s$. Data gathered indicates that the switching time may be computed as a function of two independent variables. First, it has been observed that $t_s$ is a function of surface area of the ferroelectric capacitor. FIG. 12 is a graph that depicts a line 1204 approximately fitted to a number of sampled points indicated along path 1202. The points represent the measured switching time as a function of square surface area of a ferroelectric capacitor. The measured points are marked by their square surface area in micrometers (namely: 50×50, 30×30, 20×20, and 10×10). The line 1204 is represented by the equation:

$$t_s = 0.0194 A_F + t_{RO}$$

where $A_F$ is the square surface area of the ferroelectric material in square micrometers and $t_{RO}$ is the rise time of signals applied to the ferroelectric capacitor.

Figure 13:
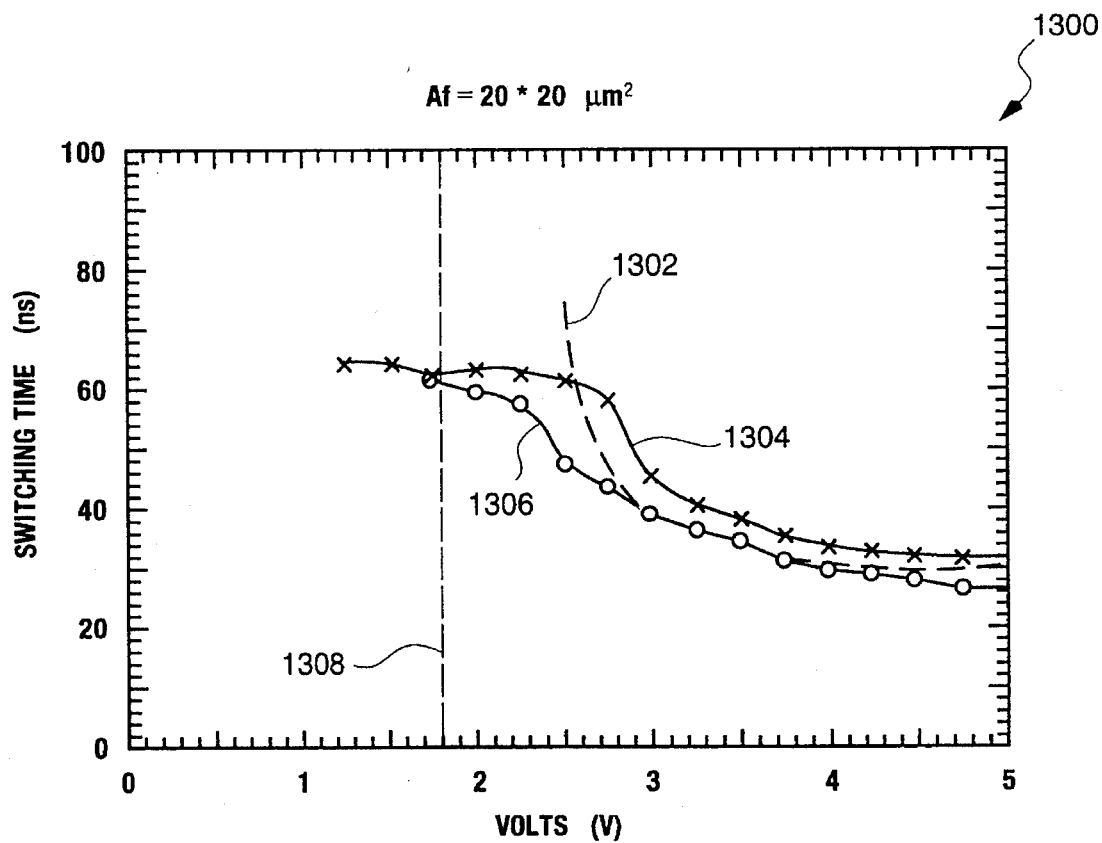
FIG. 13 is a graph of ferroelectric material polarization switching time as a function of applied electric field potential.

A second factor observed to impact the switching time of a ferroelectric capacitor is the magnitude of the electric field applied. The electric field applied must be at least equal in magnitude to the coercive electric field amplitude required to switch the ferroelectric polarization. A larger amplitude than the coercive electric field amplitude reduces the switching time of the ferroelectric capacitor. FIG. 13 is a graph that depicts the measured switching time for a ferroelectric capacitor as a function of applied electric field potential. In this example the dielectric material was 283 nanometer thick PZT with 60% titanium and having an area of 400 m² (20×20 m). The measured data points marked by "x" represent the measured switching time for a negative electric field potential of the indicated amplitude. The points marks by "o" represent the measured switching time for a positive electric field of the indicated amplitude. Path 1304 connects the points marked by "x" while path 1306 connects the points marked by "o". Dashed line 1308 indicates the approximate minimum electric field potential, 1.8 Volts in this example, required to switch the ferroelectric polarization, i.e. the coercive potential. It is noted that some switching is depicted on the graph below the coercive potential indicated by dashed line 1308. This is because in PZT the coercive potential is not a well defined parameter. The dashed line 1308 indicates only an approximate coercive potential. The curve 1302 represents the following equation which approximates the switching time as a function of the applied electric field amplitude:

$$t_s = ((Q_{sw} A_F R_L)/(V_{AP} - V_c)) + t_{RO}$$

where $Q_{sw}$ is the switching charge, $R_L$ is the load resistor, $V_{AP}$ is the amplitude of the applied electric field, $V_c$ is the amplitude of the minimum coercive electric field, and $A_F$ and $t_{RO}$ are as above.

Combining the above approximations of switching time one can approximate a desired signal rise time as:

$$t_R = 0.0194 A_F * 1.3$$

assuming that the computed rise time ($t_R$) is larger than the minimum required rise time for a plate of the ferroelectric capacitor ($t_W$). If the computed rise time ($t_R$) is less than the minimum plate rise time ($t_W$), then another approximation should be used such that:

$$t_R >= 0.5 t_W$$

As used herein, the term "plate rise time" (indicated by the symbol $t_W$) refers to the time required for an electrode, in contact with a surface of a ferroelectric memory element, to accumulate its maximum charge after the application of an electric potential. The accumulated charge at the electrode of a ferroelectric memory element creates the electric field required to switch the polarization of the ferroelectric element. For the definition of the plate rise time it is assumed that the electric potential that causes the electrode plate to accumulate charge is applied essentially instantaneously. The plate rise time should be distinguished from the rise time of the shaped pulses applied to the opposite plate, the bit line, or other portions of the circuit, that is, the pulses that this invention discloses the shaping of. In the conventional art, these latter pulses were generally square waveforms in which the signal rises and falls as rapidly as possible, far more rapidly than the plate rise time or the shaped pulses of the present invention. However, even such rapidly rising square waveform pulses did not raise the plate immediately to it full voltage, but rather caused a rise over time, $t_W$, which, as known in the art, depends on several parameters of the device. Thus, what the equations above reveal is that rather than use a square waveform pulse, one should consider $t_W$ in determining the shape of the pulse to be applied to the plate. It should be understood that in this context "plate" is interpreted broadly: it can be an electrode of a ferroelectric capacitor, a gate of a ferroelectric transistor, an electrode of a raw array memory cell, or the electrode of any other ferroelectric device useful in a memory circuit.

Figure 11:
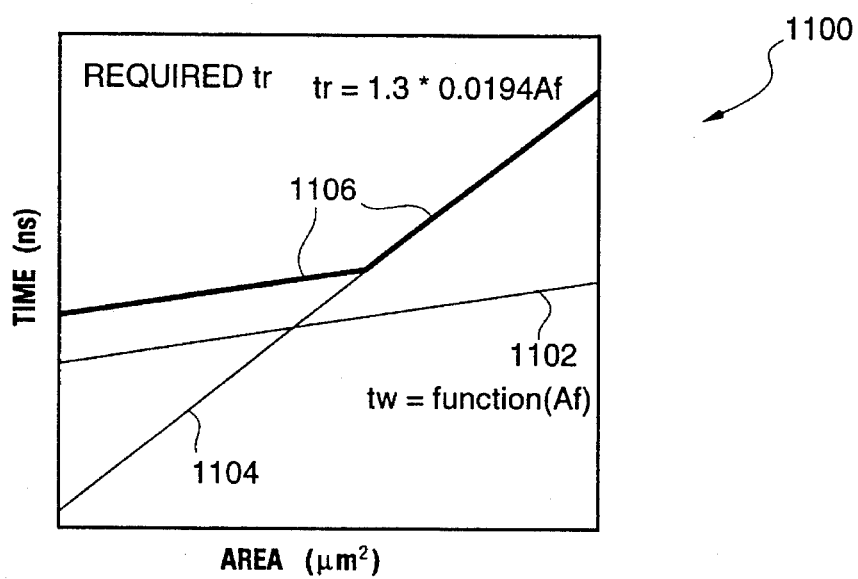
FIG. 11 is a graph showing the desired signal rise time versus a computed signal rise time and the rise time of a capacitor plate line.

The above relationship between computed rise time and minimum plate rise time is depicted in FIG. 11. Line 1104 is computed rise time while the minimum plate rise time is shown in line 1102 (as an unspecified function of square surface area of the ferroelectric capacitor). The computed rise time value of line 1104 may be used for the desired rise time approximation until it is below the minimum plate rise time depicted as line 1102 when the minimum plate rise time line 1102 must then be used to approximate the desired rise time. Thus the preferred rise time is given as curve 1106 formed by combining the two approximations described above in regions of capacitor surface area where each approximation is valid. Note that curve 1106 is shifted slightly so that other curve will not be covered up in the graph.

Another approach to estimating the minimum rise (or fall) time of a slower signal applied to a ferroelectric material is suggested by the time delay between initiating the pulsed signal and the activation of the sense amplifier circuits, associated with the ferroelectric memory elements, used to read the stored value. A sense amplifier circuit is used in a ferroelectric memory device (as in most DRAM devices) to sense and restore the present value stored in a memory cell. There is typically a delay time after initiating the pulsed signal applied to the ferroelectric material before the sense amplifier is activated to sense the current stored value. This delay time permits the data value stored in the memory cell to "stabilize" on the associated data sense line. This delay time, hereinafter referred to as the "sense delay time" (or $t_P$), has been determined to be useful to estimate the minimum rise (or fall) time which may be used in the present invention to reduce polarizibility fatigue. Sense amplifier circuits and the operation thereof are known to those of ordinary skill in the art and an example is more completely disclosed in co-pending U.S. patent application Ser. No. 08/092,233, filed on Jul. 15, 1993 by Mihara et al.

Applying the principles discussed above, the minimum rise time ($t_R$) can be estimated as:

$$t_R = 0.0194 A_F * 1.3$$

assuming that the computed rise time ($t_R$) is larger than the sense delay time ($t_P$). If the computed rise time ($t_R$) is less than the sense delay time ($t_P$), then another approximation should be used such that:

$$t_R >= 0.5 t_P$$

Drive Circuits

Referring again to memory array 10 of FIG. 1, signals applied to a word line 162 and a bit line 164 of FIG. 1 create an electric field across the electrodes of the ferroelectric capacitor 102 of a selected memory cell 100. A memory cell 100 is selected by operation of the address and control logic discussed above. The electric field is of sufficient amplitude to force the polarization of the ferroelectric capacitor 102 to retain the polarization matching that of the electric field. Row signal drive 110 applies signals to bus 172, through row address mux 114, onto a word line 162 selected by the address and control operations discussed above. In a similar manner, column signal drive 112 applies signals to bus 170, through column address mux 116, onto a bit line 164 selected by the address and control operations discussed above. Prior memory array designs applied essentially square waveform signals to the capacitor electrodes (the term "square waveform" as used herein and as discussed above refers to a geometric characterization of the rapid rise and fall times of the signals applied to the capacitor electrodes of prior designs).

Row signal drives 110 of FIG. 1 and 210 of FIG. 2 as well as column signal drives 112 of FIG. 1 and 212 of FIG. 2 are each representative of a circuit which applies a signal to an electrode of a ferroelectric capacitor for purposes of changing the polarization thereof. Row signal drives 110 of FIG. 1 and 210 of FIG. 2 as well as column signal drives 112 of FIG. 1 and 212 of FIG. 2 are discussed below with reference to FIGS. 3 through 5. For simplicity, the circuits are described as apparatus which converts an input square waveform into a desired output waveform to be applied to an electrode of a selected ferroelectric capacitor. One skilled in the art will recognize that there exists many known methods and a variety of apparatus for creating non-square waveforms, either by direct generation or by conversion of an input waveform. The circuits shown in FIGS. 3 through 5 and discussed below are intended only as exemplary embodiments of apparatus which may be employed in practicing the methods of the present invention.

Figure 7:
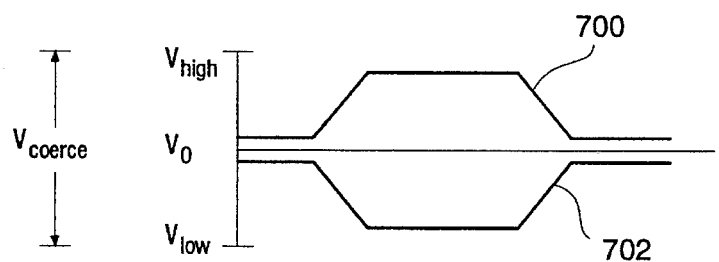
FIG. 7 shows two waveforms having equal amplitudes but opposite polarities, one each applied to each of two electrodes of a ferroelectric capacitor of the memory array of FIG. 1.

In an array of "raw" memory cells as depicted in FIG. 1, a subset of memory cells 100 share a common word line 162. Another subset of memory cells 200 share a common bit line 164. A signal applied to one electrode, either a row line 162 or a bit line 164, is simultaneously applied to all other electrodes of other ferroelectric capacitors 102 attached to that same row line 162 or bit line 164. The signal applied to each electrode, individually, is therefore lower than the amplitude required to coerce the ferroelectric capacitor to a new polarization state. However, when the signal applied to a row line 162 is combined with a signal of similar amplitude but opposite polarity on an intersecting bit line 164, the resultant field strength across the ferroelectric capacitor 102 connected to both intersecting lines is sufficient to coerce the ferroelectric capacitor 102 polarization to switch. Row signal drive 110 and column signal drive 112 of FIG. 1 are preferably adapted to generate similar signals but of opposite polarities and each signal individually having an amplitude less than the coercive threshold value required to change the polarization of the ferroelectric capacitor. FIG. 7 shows an example of such waveforms as may be applied to a row line 162 and a corresponding intersecting bit line 164. Waveform 700 of FIG. 7 is applied to a selected one of row lines 162 of FIG. 1 and waveform 702 of FIG. 7 is applied to a selected one of bit lines 164 of FIG. 1. Waveform 700 depicts a signal as applied to a row line 162 of FIG. 1 having a maximum amplitude of ($V_{HIGH}-V_0$); less than the coercive amplitude $V_{COERCE}$. Waveform 702 depicts a signal as applied to a bit line 164 of FIG. 1 having a maximum amplitude of ($V_{LOW}-V_0$); also less than the coercive amplitude $V_{COERCE}$. Only at the intersection of a selected word line 162 and a selected bit line 164 will the field strength rise to an amplitude of ($V_{HIGH}-V_{LOW}$); greater than or equal to $V_{COERCE}$.

It is to be expressly understood that the combination of two waveforms discussed above with respect to FIG. 7 represents the best known mode of practicing the present invention at this time. For purposes of simplification in the discussion below, the waveforms will be discussed in terms of a single waveform applied to one of the two electrodes of the capacitor 102 of a selected one of memory cells 100. One skilled in the art will readily recognize that similar drive circuitry with appropriate inversion and gain control circuitry may be utilized in both row signal drive 110 and column signal drive 112 of FIG. 1.

Those skilled in the art will recognize that signals applied to the word lines 262 of the "active" memory array 20 shown in FIG. 2 are not applied to either electrode of the associated ferroelectric capacitors 202. Word lines 262 are attached only to the gates of gating transistors 201 of a row of memory cells 200. Signals applied to a word line 262 serve only to close the gate of all gating transistors 201 common to the selected word line 262. After all gating transistors 201 common to the selected word line 262 are closed, column signal drive 212 applies a signal to bus 270, through mux 216, onto a selected plate line 264. The signal applied to the selected plate line 264 is common to all memory cells 200 connected to the selected plate line 264. Only the memory cell 200 which intersects both the selected plate line 264 and the selected word line 262 has the gating transistor 201 closed to permit the signal on the selected plate line 264 to be applied through the gating transistor 201 to one electrode of the selected ferroelectric capacitor 202. The polarization direction of the particular memory cell 200 at the intersection of the selected word line and the selected bit line is then altered by the electric field produced from application of the signal on the selected plate line 264 to one electrode of the ferroelectric capacitor 202 and the terminator 118 connected to the opposing electrode. In view of the above, it is apparent to those of ordinary skill in the art that signals applied to word lines 262 of memory array 20 may be of any appropriate waveform shape. The waveform shape of the signal applied to plate line 264 by column signal drive 212 alone determines the shape of the rise and fall of the coercive electric field across the selected ferroelectric capacitor 202.

Figure 3:
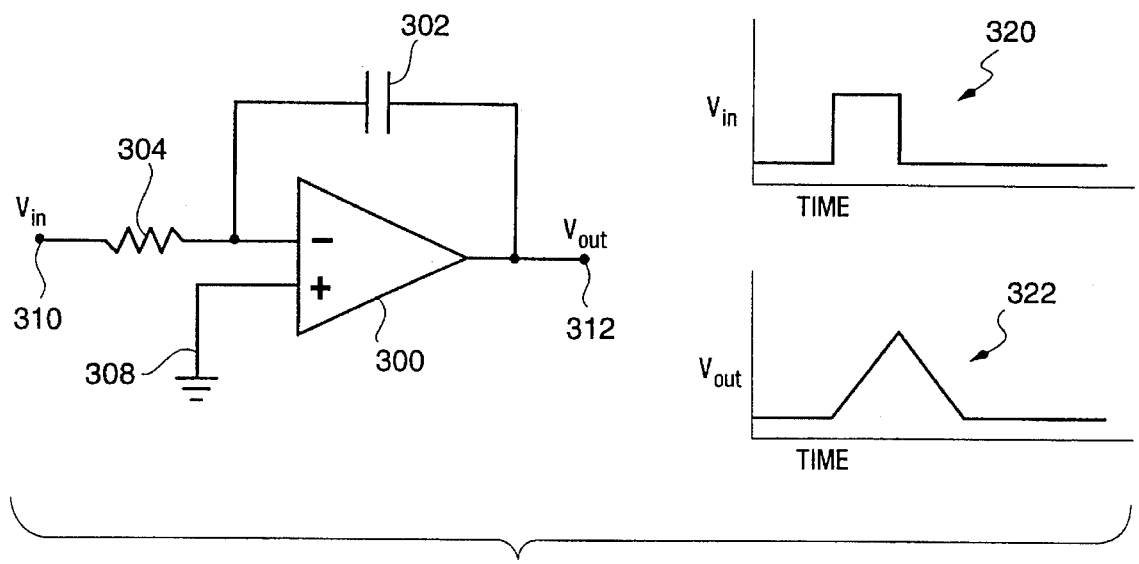
FIG. 3 diagrams a circuit which implements the methods of the present invention to apply a triangular (sawtooth) waveform to an electrode of a ferroelectric capacitor of the memory array of FIG. 1.
Figure 4:
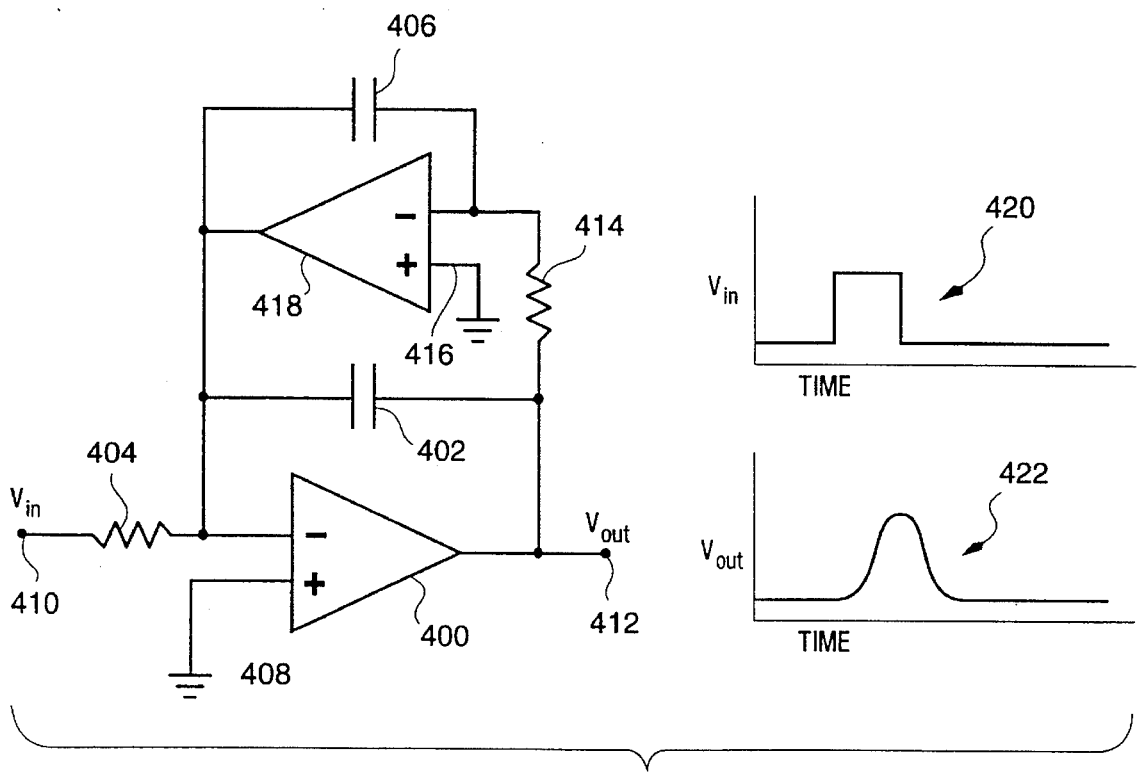
FIG. 4 diagrams a circuit which implements the methods of the present invention to apply a Gaussian waveform to an electrode of a ferroelectric capacitor of the memory array of FIG. 1.
Figure 5:
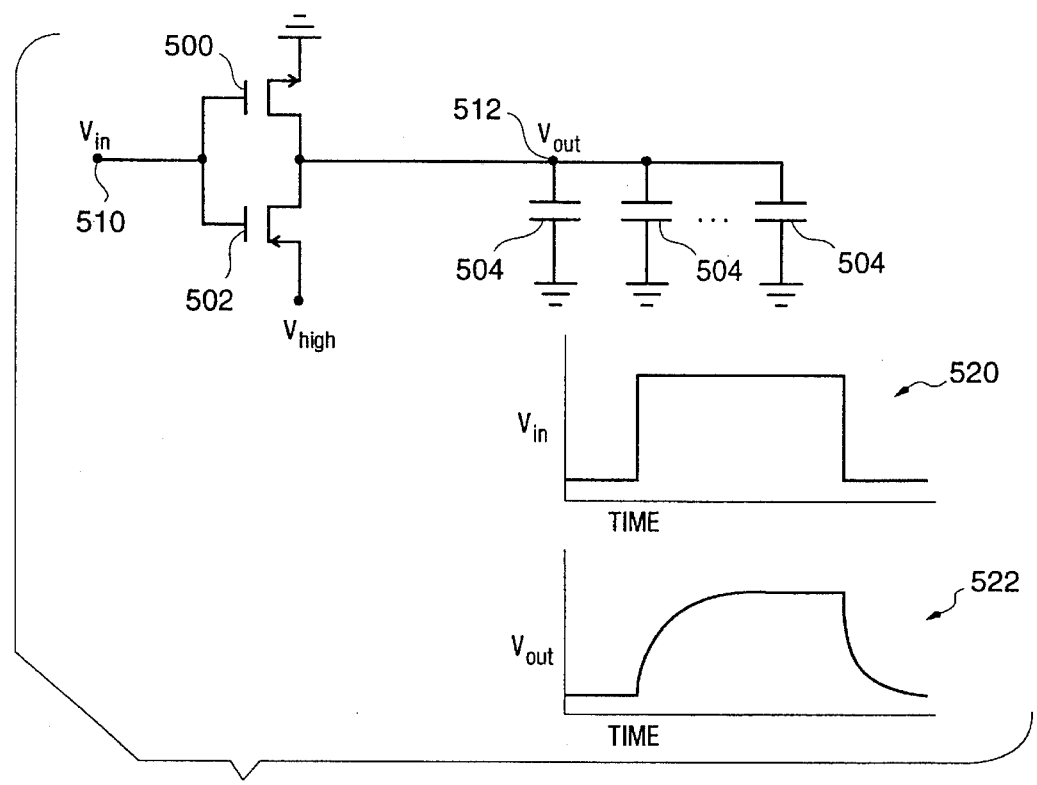
FIG. 5 diagrams a circuit which implements the methods of the present invention to apply a waveform with exponential rise and fall times to an electrode of a ferroelectric capacitor of the memory array of FIG. 1.

FIGS. 3 through 5 each depict exemplary preferred embodiments of a circuit within row signal drive 110 or column signal drive 112 which provides an output signal with slower rise and fall times than a corresponding input signal. The input signal, $V_{IN}$, is generated by known signal generation capabilities as a square waveform signal. Apparatus and methods for generating such a square waveform are known to one skilled in the art. A square waveform signal is presumed to be generated within other logic of row signal drive 110 and column signal drive 112 of FIG. 1 in response to signals received from control logic 104 over control bus 160 indicating a need to write a value into a selected memory cell 100. The circuits depicted in FIGS. 3 through 5 are exemplary of apparatus capable of transforming such a square input waveform signal applied to $V_{IN}$ into an output signal waveform as shown on $V_{OUT}$ in each of FIGS. 3 through 5.

FIG. 3 shows one exemplary embodiment of apparatus of the present invention in which an analog signal integrator is used to produce a triangular waveform 322 at $V_{OUT}$ 312 in response to a square waveform 320 provided at $V_{IN}$ 310. Triangular waveform 322 and input square waveform 320 are graphs of signal amplitude versus time as they might be viewed on a standard oscilloscope. The signal at $V_{OUT}$ 312 is applied to one electrode of a ferroelectric capacitor 102 (of FIG. 1) to reduce the fatigue effects of frequent switching of ferroelectric polarization. Op-amp 300 has one input grounded 308 and its second input connected to $V_{IN}$ 310. One skilled in the art will readily recognize that appropriate selection of the values for resistor 304 and capacitor 302 controls the gain of the amplifier circuit and the timing of the output signal applied to $V_{OUT}$ 312. In addition, one skilled in the art will readily recognize that the signal applied to $V_{OUT}$ 312 may be inverted as required by appropriate inverting amplifiers known in the art.

The resultant triangular waveform 322 represents a slowing of the rise and fall times of the signals applied to the electrodes of a ferroelectric capacitor 102 of a memory cell 100 (both of FIG. 1) as compared to standard digital square waveforms. This slowing of the signal rise and falls times is demonstrated to reduce the fatiguing effects of rapid switching of the ferroelectric polarization.

FIG. 4 shows another exemplary embodiment of apparatus of the present invention in which an analog signal integrator is used in conjunction with a positive feedback integrator to produce a Gaussian (bell shaped) waveform 422 at $V_{OUT}$ 412 in response to a square waveform 420 provided at $V_{IN}$ 410. Gaussian waveform 422 and input square waveform 420 are graphs of signal amplitude versus time as they might be viewed on a standard oscilloscope. Output waveform 422 is referred to as Gaussian in the sense that it resembles a normal distribution probability curve. The signal at $V_{OUT}$ 412 is applied to one electrode of a ferroelectric capacitor 102 (of FIG. 1) to reduce the fatigue effects of frequent switching of ferroelectric polarization. Op-amp 400 has one input grounded 408 and its second input connected to $V_{IN}$ 410. A second integrating op-amp 418 with associated resistor 414 and capacitor 406 is used to provide positive feedback to the first integrating op-amp 400. One skilled in the art will readily recognize that appropriate selection of the values for resistor 404, resistor 414, capacitor 406, and capacitor 402 controls the gain of the amplifier circuits, the amount of positive feed back, and the timing of the output signal applied to $V_{OUT}$ 412. In addition, one skilled in the art will readily recognize that the signal applied to $V_{OUT}$ 412 may be inverted as required by appropriate inverting amplifiers known in the art.

The resultant Gaussian waveform 422 represents a slowing of the rise and fall times of the signals applied to the electrodes of a ferroelectric capacitor 102 of a memory cell 100 (both of FIG. 1) as compared to standard digital square waveforms. This slowing of the signal rise and falls times is demonstrated to reduce the fatiguing effects of rapid switching of the ferroelectric polarization.

FIG. 5 shows another exemplary embodiment of apparatus of the present invention in which a PMOS transistor 500 and an NMOS transistor 502 are used in conjunction with a plurality of capacitors to generate output waveform 522 at $V_{OUT}$ 512 in response to a square waveform 520 provided at $V_{IN}$ 510. Output waveform 522 and input square waveform 520 are graphs of signal amplitude versus time as they might be viewed on a standard oscilloscope. The output waveform 522 is characterized by exponential curvature of the rise and fall times. The signal at $V_{OUT}$ 512 is applied to one electrode of a ferroelectric capacitor 102 (of FIG. 1) to reduce the fatigue effects of frequent switching of ferroelectric polarization. When $V_{IN}$ 510 is initially low as shown at the start of input waveform 520, the gate of PMOS transistor 500 is closed and the gate of NMOS transistor 502 is open so that $V_{OUT}$ 512 is pulled down to ground through PMOS transistor 500. When $V_{IN}$ 510 rises to a high value, the gate of PMOS transistor 500 opens and the gate of NMOS transistor 502 closes. In this state, capacitors 504 begin to charge through NMOS transistor 502 connected to $V_{HIGH}$. The quantity and capacitance of capacitors 504 as well as the internal resistance of NMOS transistor 502 determines the time required to fully charge capacitors 504 to $V_{HIGH}$. The signal at $V_{OUT}$ rises exponentially as capacitors 504 charge. When $V_{IN}$ 510 again falls to a low level, the gate of PMOS transistor 500 closes and the gate of NMOS transistor 502 opens to permit capacitors 504 to discharge to ground through PMOS transistor 500. The quantity and capacitance of capacitors 504 as well as the internal resistance of PMOS transistor 500 determines the time required to charge fully discharge capacitors 504 to ground. The signal at $V_{OUT}$ falls exponentially as capacitors 504 discharge to ground. One skilled in the art will readily recognize that the signal at $V_{OUT}$ 512 may be inverted as required by appropriate inverting amplifiers known in the art.

The resultant waveform 522 represents a slowing of the rise and fall times of the signals applied to the electrodes of a ferroelectric capacitor 102 of a memory cell 100 (both of FIG. 1) as compared to standard digital square waveforms. This slowing of the signal rise and falls times is demonstrated to reduce the fatiguing effects of rapid switching of the ferroelectric polarization.

Figure 6:
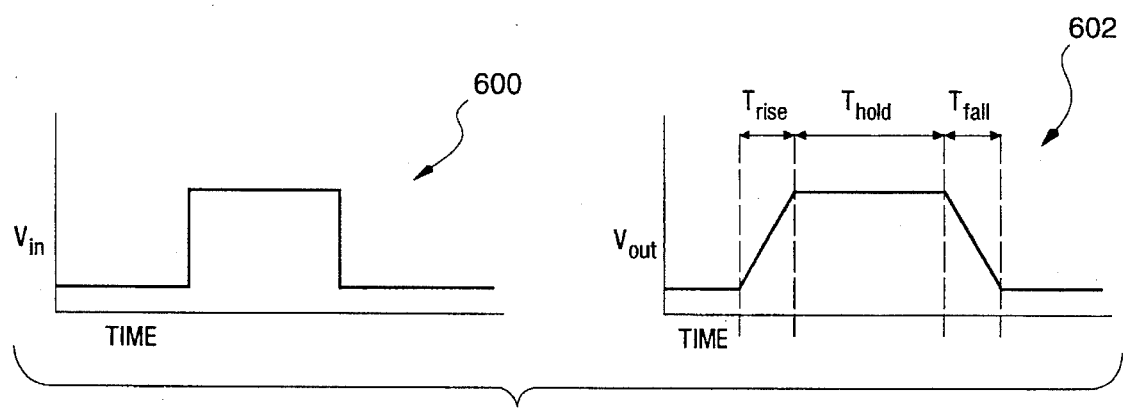
FIG. 6 depicts a generalized waveform generated by the methods of the present invention in which the rise and fall times of a signal are altered then applied to a ferroelectric capacitor of the memory array of FIG. 1.

FIGS. 3 through 5 depict each depicts a exemplary embodiment of a circuit which produces particular output waveforms in response to an input square waveform. FIG. 6 is a more general depiction of an output waveform 602 produced by an apparatus of the present invention in response to receipt of an input square waveform 600. Output waveform 602 is characterized by its slower rise time ($T_{RISE}$) and its slower fall time ($T_{FALL}$). Between the rise and fall of output waveform 602, the signal is held high for a period of time ($T_{HOLD}$). In addition to the duration of each time period ($T_{RISE}$, $T_{HOLD}$, and $T_{FALL}$), the output waveform may be characterized by the shape of the output waveform 602 during the time periods corresponding to $T_{RISE}$ and $T_{FALL}$. As shown in FIG. 6, the signal rises and falls in a linear fashion but much slower than the rise and fall of the input square waveform 600. The rise and fall may be reshaped into many different forms within the scope of the present invention. Three exemplary waveform shapes and associated circuitry are discussed above with respect to FIGS, 3 through 5.

There has been described a memory device that writes information in a memory cell which includes a ferroelectric capacitor with reduced fatigue within the ferroelectric material. It should be understood that the particular embodiments shown in the drawings and described within this specification are for purposes of example and should not be construed to limit the invention which will be described in the claims below. Further, it is evident that those skilled in the art may now make numerous uses and modifications of the specific embodiments described, without departing from the inventive concepts. For example, other addressing or control logic designs may be employed. Or the sequence or timing of signals described above may be altered while achieving an equivalent result in slowing the rise and fall of signals applied to the electrodes of a ferroelectric capacitor. Or equivalent structures and process may be substituted for the various structures and processes described. Or a variety of different circuits and ferroelectric materials may be used. Consequently, the invention is to be construed as embracing each and every novel feature and novel combination of features present in, or possessed by, the memory apparatus and processes described.

We claim:

1. In a non-volatile memory device having at least one ferroelectric memory element within at least one memory cell, wherein a polarization state of said ferroelectric memory element is associated with a stored logic "1" and another polarization state of said ferroelectric memory element is associated with a stored logic "0", a method for reducing polarizability fatigue of said ferroelectric memory element comprising the steps of:

receiving a request to coerce the state of polarization of said ferroelectric memory element to a desired state of polarization;

generating, responsive to said request, a waveform electric field signal having a directional polarity and having a maximum amplitude sufficient to alter said state of polarization of said ferroelectric memory element, said signal having a predetermined rise time, during which the amplitude of said signal changes from a first level to said maximum amplitude, wherein said predetermined rise time is selected from the group comprising, about one half the plate rise time of said ferroelectric memory element, and about one half the sense delay time of said ferroelectric memory element; and applying, responsive to said request, said signal to said ferroelectric memory element such that the state of polarization of said ferroelectric memory element is coerced to said desired state of polarization.

2. The method of claim 1 wherein said ferroelectric memory element is a ferroelectric capacitor.

3. The method of claim 1 wherein said signal has a predetermined fall time, during which the amplitude of said signal changes from said maximum amplitude back to said first level, wherein said predetermined fall time is selected from the group comprising, about one half the plate rise time of said ferroelectric memory element, and about one half the sense delay time of said ferroelectric memory element.

4. The method of claim 3 wherein said signal has a predetermined hold time of about zero, during which the amplitude of said signal is held at said maximum amplitude.

5. The method of claim 3 wherein said waveform signal is a Gaussian shape waveform electric field signal.

6. The method of claim I wherein the amplitude of said waveform signal rises exponentially from said first level to said maximum amplitude over said predetermined rise time.

7. The method of claim 1 wherein the amplitude of said waveform signal falls exponentially from said maximum amplitude to said first level over said predetermined fall time.

8. A non-volatile memory device comprising at least one ferroelectric memory element within at least one memory cell wherein a polarization state of said ferroelectric memory element is associated with a stored logic "1" and another polarization state of said ferroelectric memory element is associated with a stored logic "0";

means for generating a waveform electric field signal, said signal having a directional polarity and having a maximum amplitude sufficient to alter said state of polarization of said ferroelectric memory element, said signal having a predetermined rise time, during which the amplitude of said signal changes from a first level to said maximum amplitude, wherein said predetermined rise time is selected from the group comprising, about one half the plate rise time of said ferroelectric memory element, and about one half the sense delay time of said ferroelectric memory element; and means connected to an electrode of said ferroelectric memory element and associated with said means for generating for applying said signal to said ferroelectric memory element such that the state of polarization of said ferroelectric memory element is coerced to a desired state of polarization.

9. The memory device of claim 8 wherein said ferroelectric memory element is a ferroelectric capacitor.

10. The memory device of claim 8 wherein said signal has a predetermined fall time, during which the amplitude of said signal changes from said maximum amplitude back to said first level, wherein said predetermined fall time is selected from the group comprising, about one half the plate rise time of said ferroelectric memory element, and about one half the sense delay time of said ferroelectric memory element.

11. The memory device of claim 10 wherein said signal has a predetermined hold time of about zero, during which the amplitude of said signal is held at said maximum amplitude.

12. The memory device of claim 10 wherein said waveform signal is a Gaussian shape waveform electric field signal.

13. The memory device of claim 8 wherein the amplitude of said waveform signal rises exponentially from said first level to said maximum amplitude over said predetermined rise time.

14. The memory device of claim 8 wherein the amplitude of said waveform signal falls exponentially from said maximum amplitude to said first level over said predetermined fall time.

15. In a non-volatile memory device having at least one ferroelectric memory element within at least one memory cell, wherein a polarization state of said ferroelectric memory element is associated with a stored logic "1" and another polarization state of said ferroelectric memory element is associated with a stored logic "0", a method for reducing polarizability fatigue of said ferroelectric memory element comprising the steps of:

receiving a request to coerce the state of polarization of said ferroelectric memory element to a desired state of polarization;

generating, responsive to said request, a sawtooth shaped waveform electric field signal having a directional polarity and having a maximum amplitude sufficient to alter said state of polarization of said ferroelectric memory element, said signal having a predetermined rise time, during which the amplitude of said signal changes from a first level to said maximum amplitude, wherein said predetermined rise time is selected from the group comprising, about one half the plate rise time of said ferroelectric memory element, and about one half the sense delay time of said ferroelectric memory element, said signal having a predetermined hold time, equal to about zero, during which the amplitude of said signal remains at said maximum amplitude, said signal having a predetermined fall time, during which the amplitude of said signal changes from said maximum amplitude to said first level; and applying, responsive to said request, said signal to said ferroelectric memory element such that the state of polarization of said ferroelectric memory element is coerced to said desired state of polarization.

16. The method of claim 15 wherein said ferroelectric memory element is a ferroelectric capacitor.

17. In a non-volatile memory device having at least one ferroelectric memory element within at least one memory cell, wherein a polarization state of said ferroelectric memory element is associated with a stored logic "1" and another polarization state of said ferroelectric memory element is associated with a stored logic "0", a method for reducing polarizability fatigue of said ferroelectric memory element comprising the steps of:

receiving a request to coerce the state of polarization of said ferroelectric memory element to a desired state of polarization;

generating, responsive to said request, a Gaussian shaped waveform electric field signal having a directional polarity and having a maximum amplitude sufficient to alter said state of polarization of said ferroelectric memory element, said signal having a predetermined rise time, during which the amplitude of said signal changes from a first level to said maximum amplitude, wherein said predetermined rise time is selected from the group comprising, about one half the plate rise time of said ferroelectric memory element, and about one half the sense delay time of said ferroelectric memory element, said signal having a predetermined hold time during which the amplitude of said signal remains at said maximum amplitude, said signal having a predetermined fall time, during which the amplitude of said signal changes from said maximum amplitude to said first level; and applying, responsive to said request, said signal to said ferroelectric memory element such that the state of polarization of said ferroelectric memory element is coerced to said desired state of polarization.

18. The method of claim 17 wherein said ferroelectric memory element is a ferroelectric capacitor.

* * * * *